United States Patent

Lu

(10) Patent No.: US 11,506,710 B1
(45) Date of Patent: Nov. 22, 2022

(54) METHOD FOR TESTING A CIRCUIT SYSTEM AND A CIRCUIT SYSTEM THEREOF

(71) Applicant: REALTEK SEMICONDUCTOR CORPORATION, Hsinchu (TW)

(72) Inventor: Yen-Ju Lu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/388,806

(22) Filed: Jul. 29, 2021

(30) Foreign Application Priority Data

Apr. 30, 2021 (TW) ................................ 110115779

(51) Int. Cl.
*G01R 31/317* (2006.01)
*G01R 31/3185* (2006.01)
(52) U.S. Cl.
CPC ............ *G01R 31/31703* (2013.01); *G01R 31/318536* (2013.01); *G01R 31/318566* (2013.01)
(58) Field of Classification Search
CPC ...... G01R 31/31703; G01R 31/318536; G01R 31/318566
USPC .......................... 714/726, 729, 727, 732, 742
See application file for complete search history.

(56) References Cited

U.S. PATENT DOCUMENTS

| | | | | |
|---|---|---|---|---|
| 5,180,976 A | * | 1/1993 | Van Loan | G01R 1/0425 439/70 |
| 5,247,246 A | * | 9/1993 | Van Loan | G01R 1/0425 324/763.01 |
| 5,973,504 A | * | 10/1999 | Chong | G01R 31/31908 324/755.09 |
| 5,996,099 A | * | 11/1999 | Fournel | G01R 31/31922 714/724 |

(Continued)

FOREIGN PATENT DOCUMENTS

TW 558640 B 10/2003

OTHER PUBLICATIONS

Vimjam1 et al, Using Scan-Dump Values to Improve Functional-Diagnosis Methodology, 2007, IEEE, pp. 1-6. (Year: 2007).*

(Continued)

*Primary Examiner* — John J Tabone, Jr.
(74) *Attorney, Agent, or Firm* — WPAT, P.C., Intellectual Property Attorneys; Anthony King

(57) ABSTRACT

A circuit system includes a first circuit, a second circuit, and a comparator. The second circuit and the first circuit have substantially identical structures. In a testing mode, the circuit system controls the first circuit and the second circuit to perform the same testing operation synchronously. During the process of the testing operation, the comparator keeps compares a first intermediate signal internally generated by the first circuit and a second intermediate signal corresponding to the first intermediate signal that is internally generated by the second circuit. When the first intermediate signal is different from the second intermediate signal, the circuit (Continued)

system controls the first circuit and the second circuit to stop the testing operation and controls the first circuit and the second circuit to perform a scan dump operation in order to record signals transmitting by the first circuit and signals transmitting by the second circuit.

20 Claims, 4 Drawing Sheets

(56) References Cited

U.S. PATENT DOCUMENTS

| | | | | |
|---|---|---|---|---|
| 6,049,900 | A | * | 4/2000 | Fournel .............. G01R 31/2834 714/724 |
| 6,651,204 | B1 | * | 11/2003 | Rajsuman ........ G01R 31/31915 714/738 |
| 7,043,389 | B2 | | 5/2006 | Plusquellic |
| 2006/0242508 | A1 | * | 10/2006 | Simpson ........ G01R 31/318563 714/726 |
| 2007/0288818 | A1 | * | 12/2007 | Wang ............... G01R 31/31858 714/726 |

OTHER PUBLICATIONS

"Silicon design for test structures", published by James W. Hanlon on-line by Apr. 18, 2019 (URL: http://www.jameswhanlon.com/silicon-design-for-test-structures.html).

* cited by examiner

METHOD FOR TESTING A CIRCUIT SYSTEM AND A CIRCUIT SYSTEM THEREOF

CROSS-REFERENCE TO RELATED APPLICATIONS

This application claims priority of Taiwan application No, 110115779, filed on Apr. 30, 2021, which is incorporated by reference in its entirety.

TECHNICAL FIELD

The present application relates to a method of testing a circuit system, in particular, to a method and a related circuit system that can record the circuit signal when errors are found in the circuit system.

BACKGROUND

Generally, in order to maintain the quality of the chips, it is necessary to test the chips before shipment or when they are returned by the customer so as to improve the circuit design and/or chip manufacturing process by analyzing the cause of the error when a manufacturing defect is found. In the conventional technology, a scan chain is often set up in all registers of the chip, and when the chip is found to be operating improperly during the test, the scan chain is used to read out the register values of the chip to analyze the cause of the error further.

However, there is often a time lag between the discovery of a chip error triggered by a manufacturing defect and the actual activation of the scan chain to read out the chip's register value, and as a result, the value read out by the scan chain is often generated long after the chip error took place, rather than at the time of the chip error, making it difficult to effectively determine the cause of the error and the manufacturing defect. In this case, how to improve the efficiency of chip testing has become an issue to be solved in the related field.

SUMMARY OF THE INVENTION

One embodiment of the present disclosure discloses a circuit system. The circuit system includes a first circuit, a second circuit, and a comparator. The first circuit is configured to perform at least one application operation. The second circuit has a substantially identical structure with the first circuit, and is configured to perform the at least one application operation. In a testing mode, the first circuit and the second circuit synchronously perform a substantially identical testing operation. When the first circuit and the second circuit synchronously perform the testing operation, the comparator is configured to compare a first intermediate signal internally generated by the first circuit and a second intermediate signal internally generated by the second circuit and corresponding to the first intermediate signal. When the comparator determines that the first intermediate signal and the second intermediate signal are different, the first circuit and the second circuit stop performing the testing operation and start performing a scan dump operation to obtain a plurality of first transmission signals concurrently generated by the first circuit and a plurality of second transmission signals concurrently generated by the second circuit.

Another embodiment of the present disclosure discloses a method of testing a circuit system. The circuit system includes a first circuit and a second circuit, the first circuit and the second circuit have identical structures. The method includes having the first circuit and the second circuit perform a substantially identical testing operation synchronously, when the first circuit and the second circuit synchronously perform the testing operation, comparing a first intermediate signal internally generated by the first circuit and a second intermediate signal internally generated by the second circuit and corresponding to the first intermediate signal, when the first intermediate signal and the second intermediate signal are different, having the first circuit and the second circuit stop performing the testing operation, and after the first circuit and the second circuit stop performing the testing operation, having the first circuit and the second circuit perform a scan dump operation to obtain a plurality of first transmission signals concurrently generated by the first circuit and a plurality of second transmission signals concurrently generated the second circuit

DETAILED DESCRIPTION

Figure 1:
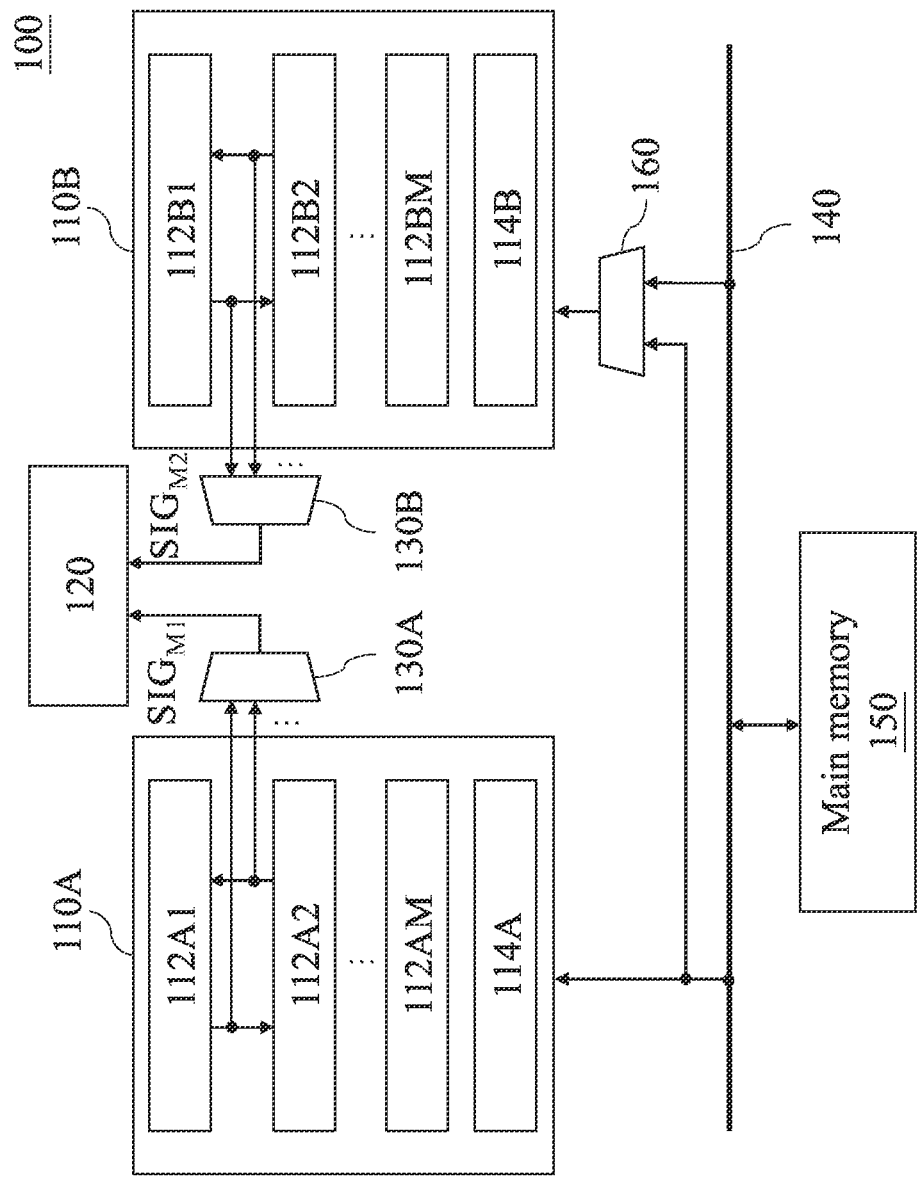
FIG. 1 is a schematic diagram illustrating a circuit system according to one embodiment of the present disclosure.

FIG. 1 is a schematic diagram illustrating a circuit system 100 according to one embodiment of the present disclosure. The circuit system 100 includes a first circuit 110A, a second circuit 110B, and a comparator 120. The first circuit 110A is used to perform at least one application operation of the circuit system 100, such as (but not limited to) reading from or writing into the memory in the circuit system 100 and executing the applications stored in the memory and performing the corresponding operations and calculations. Further, in the present embodiment, the second circuit 110B and the first circuit 110A have substantially identical structures and can perform substantially identical application operation (s). For example, the circuit system 100 may be a single chip including multiple circuits, whereas the first circuit 110A and the second circuit 110B can be substantially the same processors or computing units, such as (but not limited to) central processing units, graphic processing units, and Ethernet controllers. In some embodiments, the second circuit 110B and the first circuit 110A have exactly the same circuit layouts.

Figure 2:
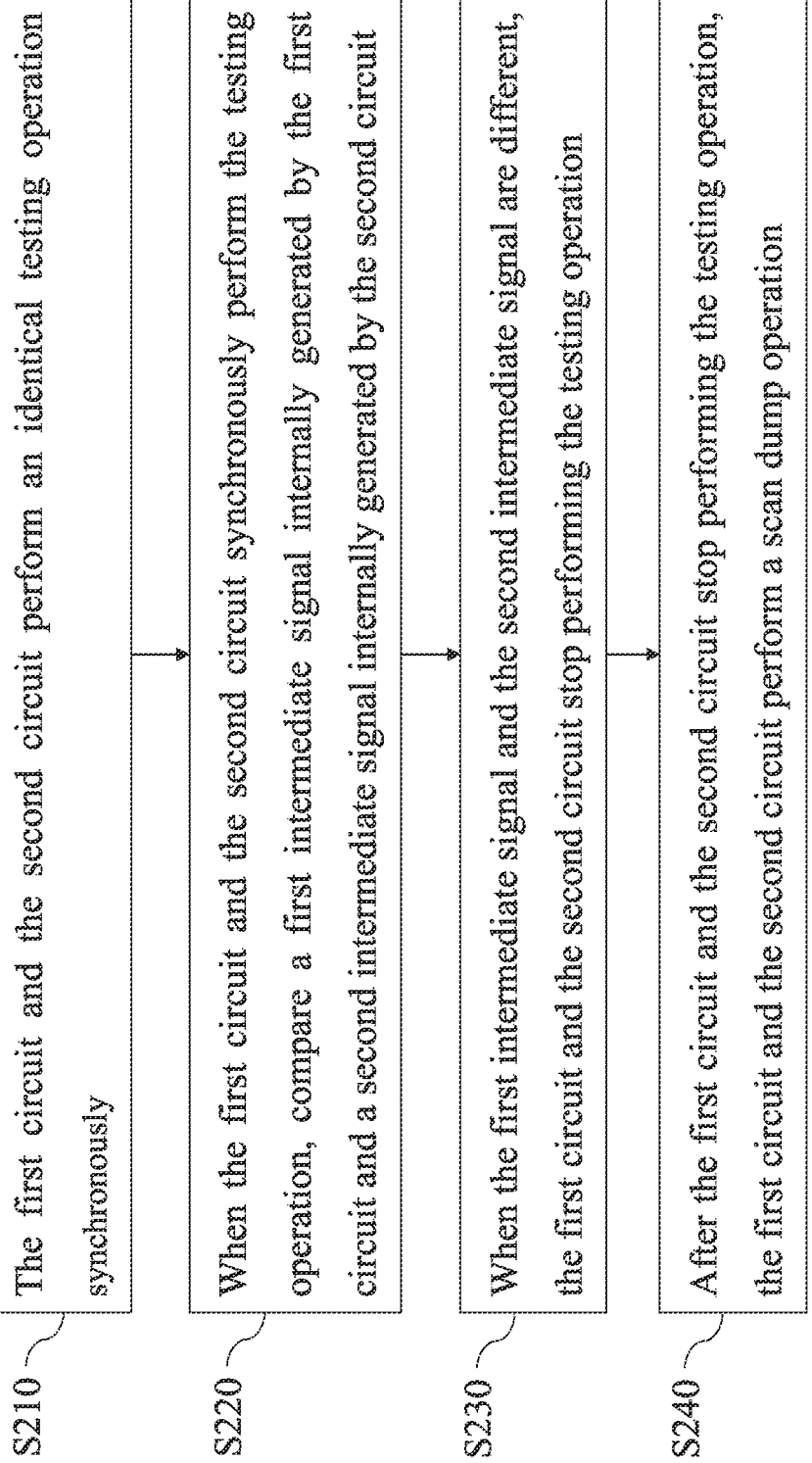
FIG. 2 is a flow chart of a method for testing the circuit system of FIG. 1.

FIG. 2 is a flow chart illustrating the method 200 for testing the circuit system 100. The method 200 includes Steps S210-S240.

Step S210: having the first circuit 110A and the second circuit 110B synchronously perform a substantially identical testing operation.

Step S220: when the first circuit 110A and the second circuit 110B synchronously perform the testing operation, comparing a first intermediate signal $SIG_{M1}$ internally generated by the first circuit 110A and a second intermediate signal $SIG_{M2}$ internally generated by the second circuit 110B.

Step S230: when the first intermediate signal $SIG_{M1}$ and the second intermediate signal $SIG_{M2}$ are different, having the first circuit 110A and the second circuit 110B stop performing the testing operation.

Step S240: after the first circuit 110A and the second circuit 110B stop performing the testing operation, having the first circuit 110A and the second circuit 110B perform a scan dump operation.

In Step S210, the first circuit 110A and the second circuit 110B can synchronously perform the same testing operation, in certain embodiments, the testing personnel can select one of the application operations of the first circuit 110A that is actually used in the practical settings as the testing operation or use commands that are specifically designed for testing as the testing operation.

In FIG. 1, the circuit system 100 may further include a system bus 140, a main memory 150, and an input command multiplexer 160. The main memory 150 can store a plurality of commands required by the testing operation, whereas the system bus 140 is coupled to the main memory 150 and the first circuit 110A; thus, the first circuit 110A can obtain the data stored in the main memory 150 via the system bus 140 to perform the corresponding operation. Further, the first input command multiplexer 160 can have a first input terminal, a second input terminal, and an output terminal, wherein the first input command multiplexer 160's first input terminal is coupled to the first circuit 110A's command input terminal, the first input command multiplexer 160's second input terminal is coupled to the system bus 140, and the first input command multiplexer 160's output terminal is coupled to the second circuit 110B's command input terminal. With this configuration, the first input command multiplexer 160 can allow the second circuit 110B to receive the same command signal that received by the first circuit 110 in the testing mode, and allow the second circuit 110B to receive a plurality of command signals required for performing an application operation from the system bus 140 in the general application mode.

Since in Step S210, the first circuit 110A and the second circuit 110B synchronously perform testing operation according to the same command, when neither of the first circuit 110A and the second circuit 110B has an error, the behaviors of the two are theoretically the same. That is, at the same time point, the signals internally generated by the first circuit 110A and the second circuit 110B are theoretically the same. In contrast, when at least one of the first circuit 110A and the second circuit 110B has an error, the signals internally generated by the two may differ.

In Step S220, the comparator 120 can continuously compare a first intermediate signal $SIG_{M1}$ internally generated by the first circuit 110A and a second intermediate signal $SIG_{M2}$ internally generated by the second circuit 110B to determine whether there is any potential error taking place. In the present embodiment, the first intermediate signal $SIG_{M1}$ and the second intermediate signal $SIG_{M2}$ are mutually corresponding signals. That is, the first intermediate signal $SIG_{M1}$ and the second intermediate signal $SIG_{M2}$ are transmission signals respectively generated by corresponding signal terminals in the corresponding component or unit of the first circuit 110A and the second circuit 110B (as discussed above, the two have substantially the same structures). As shown in FIG. 1, the first circuit 110A can include first function units 112A1~112AM, whereas the second circuit 110B can include second function units 112B1~112BM. In this case, the first intermediate signal $SIG_{M1}$ can be a data signal transmitted among the first function units 112A1~112AM, whereas the second intermediate signal $SIG_{M2}$ can be a data signal transmitted among the second function units 112B1~112BM.

For example, the first function unit 112A1 and the second function unit 112B1 can be, such as, a controller, whereas the first function unit 112A2 and the second function unit 112B2 can be, such as, memory. In this case, the first intermediate signal $SIG_{M1}$ can be a data signal transmitted between the first controller 112A1 and the first memory 112A2, whereas the second intermediate signal $SIG_{M2}$ can be a data signal transmitted between the second controller 112B1 and the second memory 112B2; however, the present disclosure is not limited thereto.

Further, in FIG. 1, the circuit system 100 may further include a first multiplexer 130A and a second multiplexer 130B. The first multiplexer 130A can have a plurality of input terminals and output terminals, the plurality of input terminals of the first multiplexer 130A are respectively coupled to a plurality of specific signal terminals (not limited to those shown in the drawing) of the first function units 112A1~112AM, whereas the output terminal of the first multiplexer 130A is coupled to the comparator 120. The first multiplexer 130A can transmit the transmission signal that is being transmitted by the selected signal terminal of the plurality of specific signal terminals of the first function units 112A 1-112AM to the comparator 120 for use as the first intermediate signal $SIG_{M1}$. Similarly, the second multiplexer 130B can have a plurality of input terminals and output terminals, and the second multiplexer 130B's plurality of input terminals are respectively coupled to a plurality of specific signal terminals of the second function units 112B1-112BM (in substantially the same way that the first multiplexer 130A coupled to the first function units 112A1~112AM), and the second multiplexer 130B's output terminal is coupled to the comparator 120. The second multiplexer 130B can transmit the transmission signal that is being transmitted by the selected signal terminal of the plurality of specific signal terminals of the second function units 112B1-112BM to the comparator 120 for use as the second intermediate signal $SIG_{M2}$.

In other words, the circuit system 100 may, according to the requirements of the testing operation, use the first multiplexer 130A and the second multiplexer 130B to select the signals that are being transmitted by the corresponding signal terminals of the first circuit 110A and the second circuit 110B as the first intermediate signal $SIG_{M1}$ and the second intermediate signal $SIG_{M2}$, and then use the comparator 120 to perform the comparison operation. In this way, the testing operation become more flexible, thereby increasing the efficiency of the testing operation.

Generally, when neither of the first circuit 110A and the second circuit 110B has an error, the first intermediate signal $SIG_{M1}$ and the second intermediate signal $SIG_{M2}$ should have the same value. In contrast, when at least one of the first circuit 110A and the second circuit 110B has an error, the first intermediate signal $SIG_{M1}$ may differ from the second intermediate signal $SIG_{M2}$. In Step S230, when the first intermediate signal $SIG_{M1}$ and the second intermediate signal $SIG_{M2}$ are different, it means that it is likely to have an error. In this case, the first circuit 110A and the second circuit 110B may stop performing testing operation according to the comparison results of the comparator 120. In some embodiments, the comparator 120 is further configured to control a clock circuit (not shown) of the circuit system 100, and the comparator 120 would interrupt the clock signals required by the first circuit 110A and the second circuit 120B when it is determined that the first intermediate signal $SIG_{M1}$ and the second intermediate signal $SIG_{M2}$ are different, so as to stop the first circuit 110A and the second circuit 120B from performing any operations.

Next in Step S240, the first circuit 110A and the second circuit 110B perform a scan dump operation to obtain the transmission signal concurrently generated by the first circuit 110A and the transmission signal concurrently generated by the second circuit 110B.

In the present embodiment, the transmission signal recorded by the scan dump operation may include the input/output signals of the first circuit 110A and the second circuit 110B and the internal signals of the first circuit 110A and the second circuit 110B. In this case, the circuit system 100 can use a scan chain register to access the signals of the register of the first circuit 110A and the register of the second circuit 110B. For example, in FIG. 1, the first circuit 110A may include a first scan chain register set 114A, whereas the second circuit 110B may include a second scan chain register set 114B.

The first scan chain register set 114A may include a plurality of serially connected registers, wherein each register is coupled to the input terminal and the output terminal of the first circuit 110A and the plurality of signal terminals of the first function units 112A1~112AM. Therefore, when the first circuit 110A transmits signals using the input terminal, the output terminal, and the first signal terminal among the first function units 112A1~112AM, the first scan chain register set 114A can synchronously record the transmission signal that is being generated by the first circuit 110A at the moment. In this way, first scan chain register set 114A can continuously record the transmission signals that are being generated at the plurality of terminals of the first circuit 110A, and when the first circuit 110A performs the scan dump operation, the transmission signal that is being generated by the first circuit 110A at the moment is readout so that the research personnel can further determine that cause of the error.

Similarly, the second scan chain register set 114B may also include a plurality of serially connected registers, wherein each register is coupled to the input terminal and the output terminal of the second circuit 110B and the plurality of signal terminals of the second function units 112B1-112BM. In this way, the second scan chain register set 114B can continuously record the transmission signals that are being generated at the plurality of terminals of the second circuit 110B, and when the second circuit 110B performs the scan dump operation, the transmission signal that is being generated by the second circuit 110B at the moment is outputted.

However, the present application is not particularly limited to the implementation where the first circuit 110A and the second circuit 110B uses the scan chain register set to record and output the transmission signals transmitted by their input terminal and output terminal, and each function unit. In some other embodiments, the first circuit 110A and the second circuit 110B can use other types of interface signal storage circuits to store the signals that the first circuit 110A and second circuit 110 transmit internally or externally, depending on the needs of the testing operation, and use the interface signal storage circuit to read the transmission signals generated when the error takes place when performing the scan dump operation so that the research personnel can further analyze the cause of the error.

Since the circuit system 100 can use the comparator 120 to compare, in real-time, the first intermediate signal $SIG_{M1}$ and the second intermediate signal $SIG_{M2}$ generated by the first circuit 110A and the second circuit 110B, and immediately have the first circuit 110A and the second circuit 110B stop performing the testing operation when it determines that the first intermediate signal $SIG_{M1}$ and the second intermediate signal $SIG_{M2}$ are different and have the first circuit 110A and the second circuit 110B perform the scan dump operation to read out the signals being transmitted. Therefore the present embodiments are capable of providing more real-time data to the research personnel, thereby allowing the research personnel to figure out the cause of the error more efficiently.

Figure 3:
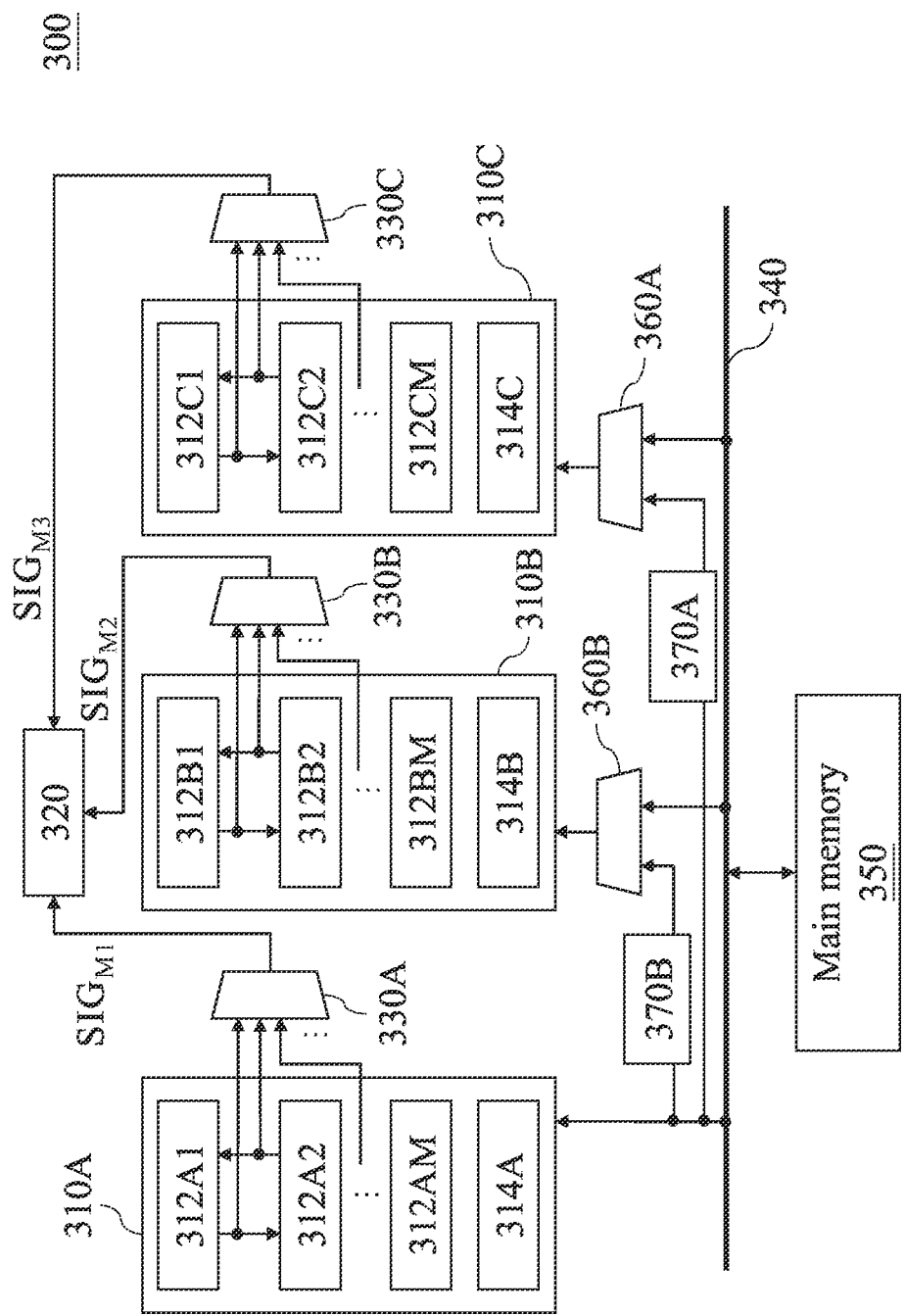
FIG. 3 is a schematic diagram illustrating a circuit system according to another embodiment of the present disclosure.

FIG. 3 is a schematic diagram illustrating a circuit system 300 according to another embodiment of the present disclosure. The circuit system 300 can be a single chip including multiple circuits and having a structure that is similar to that of the circuit system 100 and can operate according to similar principles. In FIG. 3, the circuit system 300 may include a first circuit 310A, a second circuit 310B, and a third circuit 310C. The first circuit 310A, the second circuit 310B, and the third circuit 310C may have substantially identical structures and can perform substantially identical operations. In some embodiments, the first circuit 310A, the second circuit 310B, and the third circuit 310C have completely identical circuit layouts. The circuit system 300 can have the first circuit 310A, the second circuit 310B, and the third circuit 310C perform the same testing operation, and use the first circuit 310A, the second circuit 310B, and the third circuit 310C as the reference to one another during the testing operation. When the intermediate signals generated by the first circuit 310A, the second circuit 310B, and the third circuit 310C are different, the present embodiment can infer which one of the first circuit 310A, the second circuit 310B, and the third circuit 310C has an error based on various conditions of the intermediate signals, thereby further improving the efficiency of the testing operation.

Figure 4:
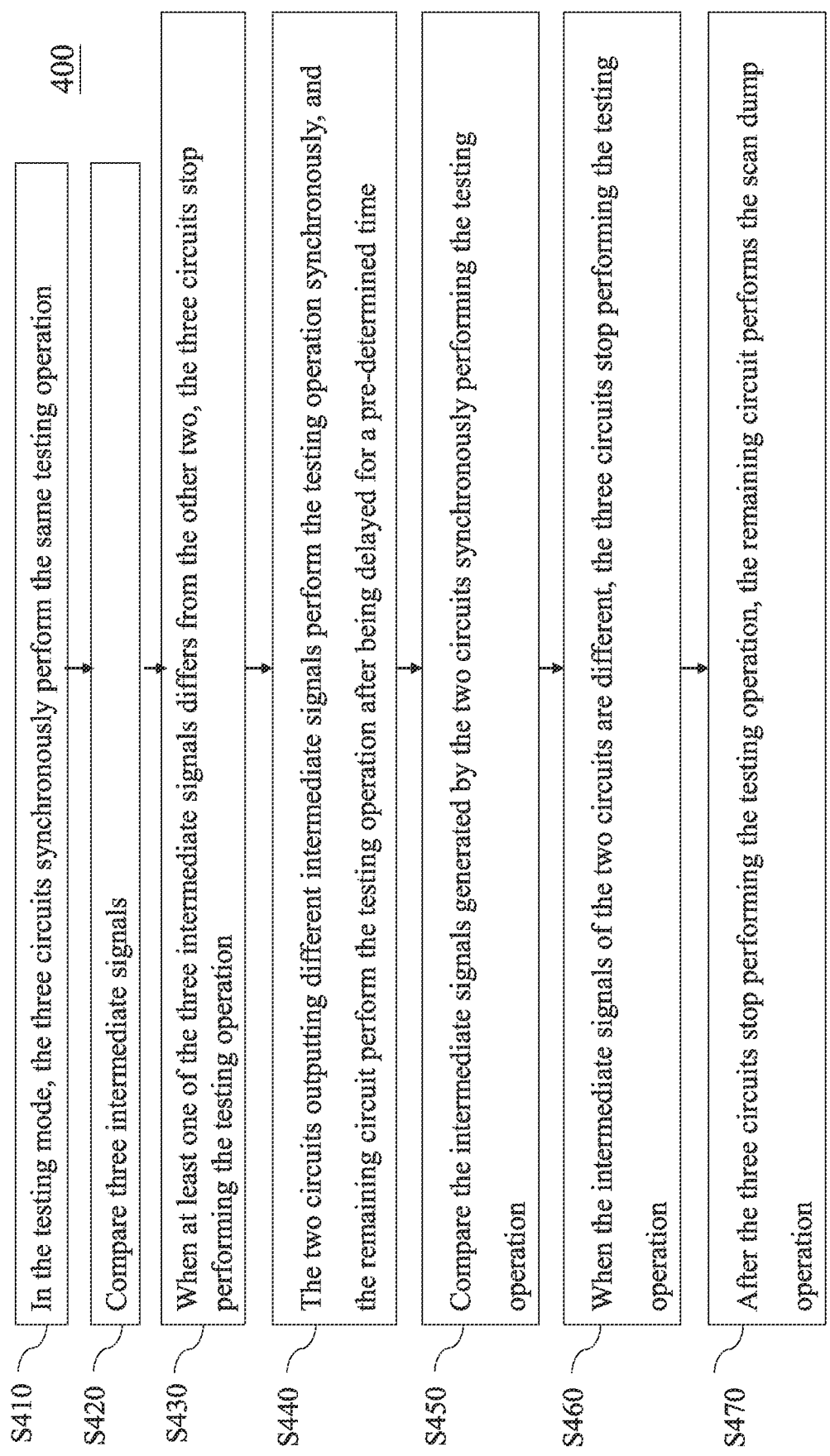
FIG. 4 is a flow chart of a method for testing the circuit system of FIG. 3.

FIG. 4 is a flow chart illustrating a method 400 for testing the circuit system 300. The method 400 may include Steps S410-S470.

Step S410: in the testing mode, having the third circuit 310C, the first circuit 310A, and the second circuit 310B synchronously perform the substantially identical testing operation.

Step S420: when the first circuit 310A, the second circuit 310B, and the third circuit 310C synchronously perform the testing operation, comparing the first intermediate signal $SIG_{M1}$, the second intermediate signal $SIG_{M2}$, and a third intermediate signal $SIG_{M3}$ internally generated by the third circuit 310C.

Step S430: when at least one of the first intermediate signal $SIG_{M1}$, the second intermediate signal $SIG_{M2}$, and the third intermediate signal $SIG_{M3}$ differs from the other two, having the first circuit 310A, the second circuit 310B, and the third circuit 310C stop performing the testing operation.

Step S440: having two circuits that output different intermediate signals perform the testing operation for the second time synchronously, and having the remaining circuit perform the same testing operation after being delayed for a pre-determined time.

Step S450: comparing intermediate signals internally generated by the two circuits that synchronously perform the testing operation.

Step S460: when the intermediate signals internally generated by the two circuits that synchronously perform the testing operation are different, having the first circuit 310A, the second circuit 310B, and the third circuit 310C stop performing the testing operation.

Step S470: after the first circuit 310A, the second circuit 310B, and the third circuit 310C stop performing the testing operation, having the circuit that has been delayed for the pre-determined time before performing the testing operation perform the scan dump operation.

In Step S410, the first circuit 310A, the second circuit 310B, and the third circuit 310C can synchronously perform the substantially identical testing operation, whereas, in Step S420, the comparator 320 can continuously compare the intermediate signals $SIG_{M1}$, $SIG_{M2}$, and $SIG_{M3}$ generated by the first circuit 310A, the second circuit 310B, and the third circuit 310C. In the present embodiment, the first intermediate signal $SIG_{M1}$ can be the signal transmitted among function units 312A1~312AM of the first circuit 310A, the second intermediate signal $SIG_{M2}$ can be the signal transmitted among function units 312B1~312BM of the second circuit 310B, and the third intermediate signal $SIG_{M3}$ can be the signal transmitted among function units 312C1~312CM of the third circuit 310C.

Further, the circuit system 300 may include a first multiplexer 330A, a second multiplexer 330B, and a third multiplexer 330C. The first multiplexer 330A, the second multiplexer 330B, and the third multiplexer 330C can transmit the signals transmitted by the selected signal terminals of the function units 312A1~312AM, 312B1~312BM, and 312C1~312CM to the comparator 320 for uses as the first intermediate signal $SIG_{M1}$, the second intermediate signal $SIG_{M2}$, and the third intermediate signal $SIG_{M3}$. In this way, the circuit system 300 can select the signal transmitted by the first signal terminal to be tested among the plurality of first signal terminals of the first function unit 312A1~312AM as the first intermediate signal $SIG_{M1}$j, selected the signal transmitted by the second signal terminal to be tested among the plurality of second signal terminals of the second function unit 312B1~312BM as the second intermediate signal $SIG_{M2}$, and selected the signal transmitted by the third signal terminal to be tested among the plurality of third signal terminals of the third function unit 312C1~312CM as the third intermediate signal $SIG_{M3}$. In this way, the testing operation can be more flexible, thereby increasing the efficiency of the testing operation.

In Step S430, when the comparator 320 determines that one of the first intermediate signal $SIG_{M1}$, the second intermediate signal $SIG_{M2}$, and the third intermediate signal $SIG_{M3}$ differs from the other two, it means that there is likely to be an error. At this point, the method 400 allows the first circuit 310A, the second circuit 310B, and the third circuit 310C to stop performing the testing operation. Generally, the possibility that the first circuit 310A, the second circuit 310B, or the third circuit 310C has an error is lower than the possibility that the first circuit 310A, the second circuit 310B, or the third circuit 310C perform the testing operation normally. Therefore, when one of the first intermediate signal $SIG_{M1}$, the second intermediate signal $SIG_{M2}$, and the third intermediate signal $SIG_{M3}$ differs from the other two, it is reasonable to infer that the circuit generating the intermediate signal that is different from the other two circuits has a higher chance of being the circuit having an error.

For example, if the comparator 320 determines that the second intermediate signal $SIG_{M2}$ and the first intermediate signal $SIG_{M1}$ are different, the second intermediate signal $SIG_{M2}$ and the third intermediate signal $SIG_{M3}$ are different, and the first intermediate signal $SIG_{M1}$ and the third intermediate signal $SIG_{M3}$ are the same, then it is reasonable to infer that the second circuit 310B may have an error. In this case, in Step S440, the method 400 can reset the first circuit 310A and the second circuit 310B and have the first circuit 310A and the second circuit 310B synchronously perform the same testing operation for the second time. Also, the method 400 can reset the third circuit 310C and have the third circuit 310C start performing the testing operation that is the same as the testing operation performed by the first circuit 310A and the second circuit 310B after being delayed for the pre-determined time after the first circuit 310A and the second circuit 310B start performing the testing operation.

Next, in Step S450, the comparator 320 can continuously compare the first intermediate signal $SIG_{M1}$ and the second intermediate signal $SIG_{M2}$. When the comparator 320 determines that the first intermediate signal $SIG_{M1}$ and the second intermediate signal $SIG_{M2}$ are different, the method 400 can have the first circuit 310A, the second circuit 310B, and the third circuit 310C stop performing the testing operation once again in Step S460. In Step S470, the method 400 has the third circuit 310C perform the scan dump operation to obtain the transmission signal concurrently generated by the third circuit 310C.

Since the third circuit 310C starts performing the testing operation after being delayed for a pre-determined time, when the comparator 320 determines that the first intermediate signal $SIG_{M1}$ and the second intermediate signal $SIG_{M2}$ are different, the third circuit 310C may still in the stage where the error is about to take place or is taking place. In this way, using the third circuit 310C to perform the scan dump operation can obtain the transmission signal that is being transmitted by the third circuit 310C when the error is about to take place or is taking place, thereby allowing the research personnel to take hold of the occurrence of the error more efficiently, and hence figure out the cause of the error. In certain embodiments, when the comparator 320 determines that the first intermediate signal $SIG_{M1}$ and the second intermediate signal $SIG_{M2}$ are different, the first circuit 310A and the second circuit 310B can also perform the scan dump operation to obtain the signals concurrently generated by the first circuit 310A and the second circuit 310B.

Since the first circuit 310A and the second circuit 310B can operate in a high-frequency clock. Therefore, even if the method 400 has the first circuit 310A and the second circuit 310B stop the testing operation as soon as possible and perform the scan dump operation when it is determined that there is an error according to the comparison results of the comparator 320, the signals that are read out may be the signal generated by the first circuit 310A and the second circuit 310B at several clock cycles after the error takes place. In this case, using the signal read by the third circuit 310C when performing the scan dump operation (the signal generated based on the same testing operation but being delayed for the pre-determined time) may be closer to the condition where the error is about to take place or is taking place, thereby allowing the research personnel to infer the cause of the error more efficiently.

In FIG. 3, the first circuit 310A, the second circuit 310B, and the third circuit 310C respectively include a first scan chain register set 314A, a second scan chain register set 314B, and a third scan chain register set 314C so as to obtain the transmission signal transmitted by the first circuit 310A, the second circuit 310B, and the third circuit 310C when performing the scan dump operation. However, in some other embodiments, the first circuit 310A, the second circuit 310B, and the third circuit 310C may also include other types of interface signal store circuits.

Further, in FIG. 3, the circuit system 300 may further include a system bus 340, a main memory 350, a first input command multiplexer 360A, a second input command multiplexer 360B, a first delay unit 370A, and a second delay unit 370B. In the present embodiment, the first delay unit 370A is coupled to a command input terminal of the first circuit 310A. The first delay unit 370A can receive a plurality of command signals received by the first circuit 310A and output the plurality of command signals after a first delay time, wherein the length of the first delay time is greater than or equal to 0. Moreover, in certain embodiments, the first delay unit 370A can adjust the length of the first delay time depending on the need. For example, the first delay unit 370A may include a plurality of serially connected registers (e.g., using a flip-flop), whereas the first delay unit 370A can choose the number of registers that the command signal shall pass through, thereby adjusting the first delay time of the command signal output.

The first input terminal of the first input command multiplexer 360A is coupled to the first delay unit 370A, the second input terminal of the first input command multiplexer 360A is coupled to the system bus 340, whereas the output terminal of the first input command multiplexer 360A is coupled to the command input terminal of the third circuit 310C. In this way, the third circuit 310C is allowed to receive the same command signal as the first circuit 310A via the first input command multiplexer 360A in the testing mode, and is allowed to receive the command signals required for the application to be executed from the system bus 340 in the application mode.

Similarly, in FIG. 3, the second delay unit 370B is coupled to the command input terminal of the first circuit 310A, and the first input terminal of the second input command multiplexer 360B is coupled to the second delay unit 370B, the second input terminal of the second input command multiplexer 360B is coupled to the system bus 340, and the output terminal of the second input command multiplexer 360B is coupled to the command input terminal of the second circuit 310B. In this way, the second circuit 310B is allowed to receive the same command signal as the first circuit 310A via the second input command multiplexer 360B in the testing mode, and is allowed to receive the command signal required for the application to be executed from the system bus 340 in the application mode.

Since it is theoretically not possible to anticipate which of the first circuit 310A, the second circuit 310B, or the third circuit 310C would give an error when manufacturing the circuit system 300, it is feasible to control the testing timings of the second circuit 310B and the third circuit 310C flexibly through the first input command multiplexer 360A, the second input command multiplexer 360B, the first delay unit 370A, and the second delay unit 370B, thereby allowing the research personnel to perform the testing under different conditions. Further, in certain embodiments, the circuit system 300 may include more input command multiplexers and/or delay units, thereby allowing the first circuit 310A to receive the command signals that the second circuit 310B and/or the third circuit 310C receive in a synchronous manner or delayed manner.

Moreover, in the embodiment of FIG. 4, the method 400 allows the first circuit 310A, the second circuit 310B, and the third circuit 310C to perform the testing operation through Steps S410-S430 synchronously, and then infer which of the first circuit 310A, the second circuit 310B, and the third circuit 310C has an error according to the first intermediate signal $SIG_{M1}$, the second intermediate signal $SIG_{M2}$, and the third intermediate signal $SIG_{M3}$, so as to process Steps S440-S470. However, in some other embodiments, if the research personnel has confirmed which of the first circuit 310A, the second circuit 310B, and the third circuit 310C has an error through other means, then the Steps S410-S430 of the 400 can be omitted, and the method proceeds to perform Steps S440-S470 directly.

For example, after knowing that the second circuit 310B would have an error, Step S440 can have the third circuit 310C, perform the substantially same testing operation as the first circuit 310A and the second circuit 310B after being delayed for a pre-determined time, and then in Step S450, the comparator 320 is used to compare the first intermediate signal $SIG_{M1}$ and the second intermediate signal $SIG_{M2}$. In Step S460, when the comparator 320 determines that the first intermediate signal $SIG_{M1}$ and the second intermediate signal $SIG_{M2}$ are different, the third circuit 310C would stop performing the testing operation, and then in Step S470, the third circuit 310C would perform the scan dump operation. Consequently, when the second circuit 310B is about to have an error or is having an error, the third circuit 310C can be used to record the signal that should have been received or generated in theory, thereby allowing the research personnel to determine the cause of the error more efficiently.

In summary, the circuit system and method for testing the circuit system according to embodiments of the present disclosure can allow the same circuits in the circuit system to perform testing operation synchronously, and use the comparator to compare intermediate signals generated internally by the same circuits in real-time; therefore, when an error occurs, can perform the scan dump operation in real-time to record the signals generated at the time when the error is taking place, thereby having the research personnel to understand the condition at which the error occurs more efficiently. Further, the circuit system can compare intermediate signals generated by more than three circuits so that the research personnel can infer the circuit having the error and can record the transmission signal that the circuit generates at the time when the error occurs by delaying the performance of the testing operation, thereby having the research personnel to understand the condition at which the error occurs more rapidly and further infer the cause of the error.

What is claimed is:
1. A circuit system, comprising:
   a first circuit, configured to perform at least one application operation;
   a second circuit, having a substantially identical structure with the first ire it, and is configured to perform the at least one application operation; and
   a comparator;
   wherein:
      in a testing mode, the first circuit and the second circuit synchronously perform a substantially identical testing operation;
      when the first circuit and the second circuit synchronously perform the testing operation, the comparator is configured to compare a first intermediate signal internally generated by the first circuit and a second intermediate signal internally generated by the second circuit and corresponding to the first intermediate signal; and
      when the comparator determines that the first intermediate signal and the second intermediate signal are different, the first circuit and the second circuit stop performing the testing operation and start performing a scan dump operation to obtain a plurality of first transmission signals concurrently generated by the first circuit and a plurality of second transmission signals concurrently generated by the second circuit.
2. The circuit system of claim 1, wherein:
   the first circuit comprises a plurality of first function units, and the second circuit comprises a plurality of second function units that having a connection relationship substantially identical to the plurality of first function units; and the first intermediate signal is a data signal transmitted among the plurality of first function units, and the second intermediate signal is a data signal transmitted among the plurality of second function units.

3. The circuit system of claim 2, wherein:

the plurality of first function units comprises a first controller and a first memory, and the plurality of second function units comprises a second controller and a second memory; and the first intermediate signal is a data signal transmitted between the first controller and the first memory, and the second intermediate signal is a data signal transmitted between the second controller and the second memory.

4. The circuit system of claim 2, further comprising:

a first multiplexer, having a plurality of input terminals coupled to a plurality of first signal terminals of the plurality of first function units, and an output terminal coupled to the comparator and configured to transmit a first transmission signal to the comparator as the first intermediate signal, wherein the first transmission signal is transmitted by a first signal terminal selected from the plurality of first signal terminals; and a second multiplexer, having a plurality of input terminals coupled to a plurality of second signal terminal of the plurality of second function units, and an output terminal coupled to the comparator and configured to transmit a second transmission signal to the comparator as the second intermediate signal, wherein the second transmission signal is transmitted by a second signal terminal selected from the plurality of second signal terminal.

5. The circuit system of claim 4, wherein:

the first circuit comprises a first scan chain register set, coupled to at least one input terminal and at least one output terminal of the first circuit and the plurality of first signal terminals, and configured to record the plurality of first transmission signals continuously, and record and output the plurality of first transmission signals when the first circuit performs the scan dump operation; and the second circuit comprises a second scan chain register set, coupled to at least one input terminal and at least one output terminal of the second circuit and the plurality of second signal terminal, and configured to record the plurality of second transmission signals continuously, and output the plurality of second transmission signals when the second circuit performs the scan dump operation.

6. The circuit system of claim 1, further comprising:

a third circuit, having a substantially identical structure with the first circuit and configured to perform the at least one application operation;

wherein:

in the testing mode, the third circuit synchronously performs the substantially identical testing operation as the first circuit and the second circuit;

when the first circuit, the second circuit, and the third circuit synchronously perform the testing operation, the comparator compares the first intermediate signal, the second intermediate signal, and a third intermediate signal internally generated by the third circuit and corresponding to the first intermediate signal; and when the comparator determines that one of the first intermediate signal, the second intermediate signal, and the third intermediate signal differs from the others, the first circuit, the second circuit, and the third circuit stop performing the testing operation.

7. The circuit system of claim 6, wherein after the first circuit, the second circuit, and the third circuit stop performing the testing operation, the third circuit performs the scan dump operation to obtain a plurality of third transmission signals concurrently generated by the third circuit.

8. The circuit system of claim 6, wherein:

in the testing mode, when the comparator determines that the second intermediate signal differs from the first intermediate signal and the third intermediate signal, and the first intermediate signal and the third intermediate signal are the same, the first circuit and the second circuit synchronously perform the testing operation for the second time, and the third circuit performs the testing operation substantially identical to the testing operation performed by the first circuit and the second circuit after being delayed for a pre-determined time;

when the first circuit and the second circuit synchronously perform the testing operation for the second time, the comparator compares the first intermediate signal and the second intermediate signal; and when the comparator determines that the first intermediate signal and the second intermediate signal are different, the first circuit, the second circuit, and the third circuit stop performing the testing operation for the second time, and the third circuit performs the scan dump operation to obtain a plurality of third transmission signals concurrently generated by the third circuit.

9. The circuit system of claim 8, wherein after the first circuit, the second circuit, and the third circuit stop performing the testing operation for the second time, the first circuit and the second circuit perform the scan dump operation.

10. The circuit system of claim 1, further comprising:

a third circuit, having a substantially identical structure with the first circuit and configured to perform the at least one application operation;

wherein:

in the testing mode, the third circuit performs the testing operation that is substantially identical to the testing operation performed by the first circuit and the second circuit after being delayed for a pre-determined time; and when the first intermediate signal and the second intermediate signal are different, the third circuit stops performing the testing operation and performs the scan dump operation to obtain a plurality of third transmission signals concurrently generated by the third circuit.

11. The circuit system of claim 10, further comprising:

a main memory configured to store a plurality of commands required by the testing operation;

a system bus coupled to the main memory;

a first delay unit coupled to a command input terminal of the first circuit, and configured to receive a plurality of command signals received by the first circuit and output the plurality of command signals after a first delay time; and a first input command multiplexer having a first input terminal coupled to the first delay unit, a second input terminal coupled to the system bus, and an output terminal coupled to a command input terminal of the third circuit, wherein the first input command multiplexer is configured to have the third circuit receive the plurality of command signals that are the same as the first circuit receives in the testing mode, and have the third circuit receive a plurality of command signals from the system bus in an application mode.

12. The circuit system of claim 9, further comprising:
a second delay unit coupled to the command input terminal of the first circuit, and configured to receive the plurality of command signals received by the first circuit and output the plurality of command signals after a second delay time; and
a second input command multiplexer having a first input terminal coupled to the second delay unit, a second input terminal coupled to the system bus, and an output terminal coupled to a command input terminal of the second circuit, wherein the second input command multiplexer is configured to have the second circuit receive the plurality of command signals that are the same as the first circuit receives in the testing mode, and have the second circuit receive a plurality of command signals from the system bus in an application mode.

13. A method of testing a circuit system, wherein the circuit system comprises a first circuit and a second circuity, the first circuit and the second circuit have substantially identical structures, and the method comprises:
having the first circuit and the second circuit perform a substantially identical testing operation synchronously;
when the first circuit and the second circuit synchronously perform the testing operation, comparing a first intermediate signal internally generated by the first circuit and a second intermediate signal internally generated by the second circuit and corresponding to the first intermediate signal;
when the first intermediate signal and the second intermediate signal are different, having the first circuit and the second circuit stop performing the testing operation; and
after the first circuit and the second circuit stop performing the testing operation, having the first circuit and the second circuit perform a scan dump operation to obtain a plurality of first transmission signals concurrently generated by the first circuit and a plurality of second transmission signals concurrently generated the second circuit.

14. The method of testing the circuit system of claim 13, wherein:
the first circuit comprises a plurality of first function units, and the second circuit comprises a plurality of second function units; and
the first intermediate signal is a data signal transmitted among the plurality of first function units, and the second intermediate signal is a data signal transmitted among the plurality of second function units.

15. The method of testing the circuit system of claim 14, wherein:
the plurality of first function units comprises a first controller and a first memory, and the plurality of second function units comprises a second controller and a second memory; and
the first intermediate signal is a data signal transmitted between the first controller and the first memory, and the second intermediate signal is a data signal transmitted between the second controller and the second memory.

16. The method of testing the circuit system of claim 14, further comprising:

selecting a first transmission signal concurrently generated by a first signal terminal as the first intermediate signal from a plurality of first signal terminals of the plurality of first function units; and
selecting a second transmission signal concurrently generated by a second signal terminal as the second intermediate signal from a plurality of second signal terminals of the plurality of second function units.

17. The method of testing the circuit system of claim 13, wherein the circuit system further comprises a third circuit having a same structure as the first circuit, and the method further comprises:
in the testing mode, having the third circuit synchronously perform the substantially identical testing operation as the first circuit and the second circuit;
when the first circuit, the second circuit, and the third circuit synchronously perform the testing operation, comparing the first intermediate signal, the second intermediate signal, and a third intermediate signal internally generated by the third circuit and corresponding to the first intermediate signal; and
when one of the first intermediate signal, the second intermediate signal, and the third intermediate signal differs from the others, having the third circuit stop performing the testing operation.

18. The method of testing the circuit system of claim 17, further comprising, after having the third circuit stop performing the testing operation, having the third circuit perform the scan dump operation to obtain a plurality of third transmission signals concurrently generated by the third circuit.

19. The method of testing the circuit system of claim 17, further comprising:
in the testing mode, when the second intermediate signal differs from the first intermediate signal and the third intermediate signal, and the first intermediate signal and the third intermediate signal are the same, having the first circuit and the second circuit perform the testing operation synchronously for the second time, and having the third circuit perform the testing operation substantially identical to the testing operation performed by the first circuit and the second circuit after being delayed for a pre-determined time;
when the first circuit and the second circuit synchronously perform the testing operation for the second time, comparing the first intermediate signal and the second intermediate signal;
when the first intermediate signal and the second intermediate signal are different, having the first circuit, the second circuit, and the third circuit stop performing the testing operation; and
after the first circuit, the second circuit and the third circuit stop performing the testing operation, having the third circuit perform the scan dump operation to obtain a plurality of third transmission signals concurrently generated by the third circuit.

20. The method of testing the circuit system of claim 13, wherein the circuit system further comprising a third circuit having a substantially identical structure with the first circuit, and the method further comprises:
in the testing mode, having the third circuit perform the testing operation that is the same as the testing operation performed by the first circuit and the second circuit after being delayed for a pre-determined time;
when the first intermediate signal and the second intermediate signal are different, having the third circuit stop performing the testing operation; and after the third circuit stop performing the testing operation, having the third circuit perform the scan dump operation to obtain a plurality of third transmission signals concurrently generated by the third circuit.

* * * * *